United States Patent [19]

Nelson, Jr. et al.

[11] 4,266,138

[45] May 5, 1981

[54] DIAMOND TARGETS FOR PRODUCING HIGH INTENSITY SOFT X-RAYS AND A METHOD OF EXPOSING X-RAY RESISTS

[75] Inventors: David A. Nelson, Jr.; Arthur L. Ruoff, both of Ithaca, N.Y.

[73] Assignee: Cornell Research Foundation, Inc., Ithaca, N.Y.

[21] Appl. No.: 923,756

[22] Filed: Jul. 11, 1978

[51] Int. Cl.³ .................. A61K 27/02; A61N 5/00; C08J 1/02; G21G 5/00
[52] U.S. Cl. .................. 250/492 A; 250/419; 250/493; 313/55; 313/330
[58] Field of Search ............... 250/493, 492 A, 492 B, 250/402, 492 R, 370, 419; 313/330, 55

[56] References Cited

U.S. PATENT DOCUMENTS

| | | |
|---|---|---|
| 2,153,586 | 4/1939 | Nicolson . |
| 2,332,427 | 10/1943 | Atlee et al. .................. 250/419 |
| 2,539,859 | 11/1970 | Bougle . |
| 2,678,400 | 5/1954 | McKay .................. 250/370 |
| 2,945,793 | 7/1960 | Dugdale .................. 423/446 |
| 3,101,260 | 8/1963 | Cheney .................. 423/446 |
| 3,160,779 | 12/1964 | Zunick . |
| 3,165,658 | 1/1965 | Zunick .................. 313/55 |
| 3,579,022 | 5/1971 | Hennig et al. . |
| 3,668,454 | 6/1972 | Shimura . |
| 3,700,950 | 10/1972 | Michitaka . |
| 3,821,579 | 6/1974 | Burns . |
| 3,842,305 | 10/1974 | Braun . |
| 3,890,521 | 6/1975 | Shroff . |
| 3,961,102 | 6/1976 | Ballantyne et al. . |
| 3,969,131 | 7/1976 | Fatzer et al. . |
| 3,982,148 | 9/1976 | Kaplan et al. . |
| 3,984,582 | 10/1976 | Feder et al. . |
| 4,022,932 | 5/1977 | Feng . |
| 4,035,522 | 7/1977 | Hatzakis . |
| 4,045,674 | 8/1977 | Vermeulen .................. 250/492 R |
| 4,061,829 | 12/1977 | Taylor . |
| 4,082,185 | 4/1978 | Strong .................. 423/446 |

OTHER PUBLICATIONS

Chang et al., "Limits of Electron-Beam Nonthermal Interactions", *Rec. 9th Symp. Electron, Ion & Laser Beam Tech.* 123, (1967).
Wolf, E. D., et al., "Response of the Positive Electron Resist Elvacite 2041 to Kilovolt Electron Beam Exposure, *Rec. 11th Symp., Electron, Ion and Laser Beam Tech.,* 331 (1971).
Hatzakis et al., "Electron-Beam Techniques for Fabricating Fine Metal Lines", *Rec. 11th Symp. Electron, Ion and Laser Beam Tech.,* 337 (1971).
"Team Produces 80A Metal Lines", *Industrial Research,* 19, No. 1, 19 (1977).
Spears et al., "X-Ray Replication of Scanning Electron Microscope Generated Patterns", *Fifth International Conf. on Electron and Ion Beam Tech.,* 80 (1972).
Maydan et al., "High Speed Replication of Submicron Features on Large Areas by X-Ray Lithography", I.E-.E.E., *Trans. on Electron Devices,* ED-22, 429 (1975).
Smith et al., "Prospects for X-Ray Fabrication of Si IC Devices", *J. Vac. Sci. Technology,* 12, 1321, (1975).
Feder, R. et al., "Replication of 0.1-θ Geometries with X-Ray Lithography", *J. Vac. Sci. Technol.,* 12, 1332 (1975).
Spears et al., "X-Ray Lithography-A New High Resolution Replication Process", *Solid State Technology,* 15, No. 7, 21 (1972).
Touloukian, Ed., "Thermophysical Properties of Matter", vol. 2, Thermoconductivity-Nonmetallic Solids IFI/Plenum, 1970, pp. 12 and 23.
Evans et al., "A Study of the Transformation of Diamond to Graphite", *Proc. Roy. Soc. London,* A277, 260, (1964).
Berman et al., *Physical Properties of Diamond,* Clarendon Press, Oxford, 1965, p. 295.
Muller, "On the Input Limit of an X-Ray Tube with Circular Focus", Proc. Roy. Soc., A177, (1977).
Ashcroft et al., "Lattice Thermal Conductivity: Elementary Kinectic Theory", *Solid State Physics,* Holt, Reinhart and Winston, 1976, p. 501.
Oosterkamp, "The Heat Dissipation in the Anode of an X-Ray Tube", *Philips Res. Rep.* 3, 303 (1948).
Greeneich, "X-Ray Lithography: Part I-Design Criteria for Optimizing Resist Energy Absorption; Part II--Pattern Replication with Polymer Masks", IEEE Trans. on Elect. Devices, ED 22, 434 (1975).
Henke et al., "Advances in X-Ray Analysis", 17, 150, (1973), pp. 187-188.

Dick et al., "Large-Angle L X-Ray Production by Electrons", J. Appl. Phys., 44, 815 (1973).
Sullivan et al., "Optimized Source for X-Ray Lithography of Small Area Devices", J. Vac. Sci. Technol., 12, 1325 (1975).
Thorney et al., "Electron Beam Exposure of Photo Resists", J. Electrochemical Soc., vol. 112, p. 1151, (1965).
Nelson et al., "Diamond: An Efficient Source of Soft X-Rays for High-Resolution X-Ray Lithography", Manuscript Cornell University, Ithaca, New York.

*Primary Examiner*—Alfred E. Smith
*Assistant Examiner*—T. N. Grigsby
*Attorney, Agent, or Firm*—Jones, Tullar & Cooper

[57] ABSTRACT

The present invention relates to diamond targets for carbon K x-ray generators and to a method for exposing x-ray sensitive resists to carbon K x-rays using an x-ray generator with a diamond target. It has been discovered that diamond targets, preferably of Type IIb diamond, will dissipate considerably more power and thus produce higher intensity x-rays than graphite targets despite diamond's lower limiting temperature. Such x-rays allow one to expose an x-ray resist through a mask in only 67 seconds and achieve a resolution of $0.2\mu$.

14 Claims, 7 Drawing Figures

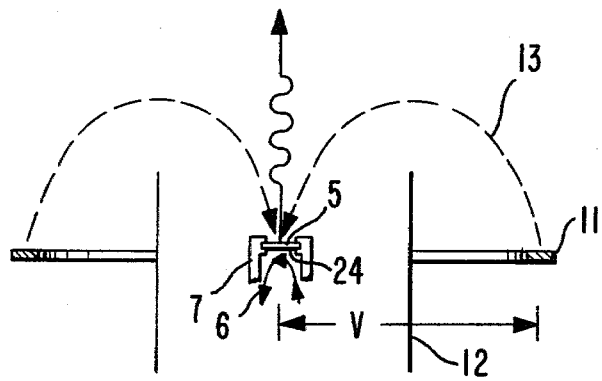
FIG. 3b
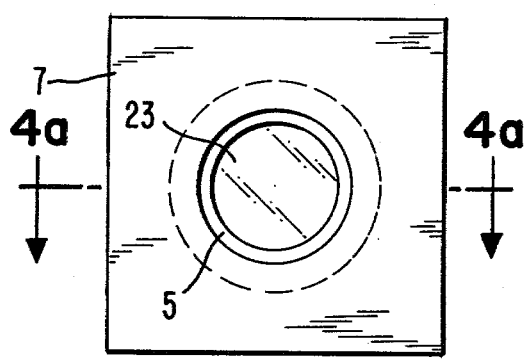
FIG. 4a
FIG. 4b
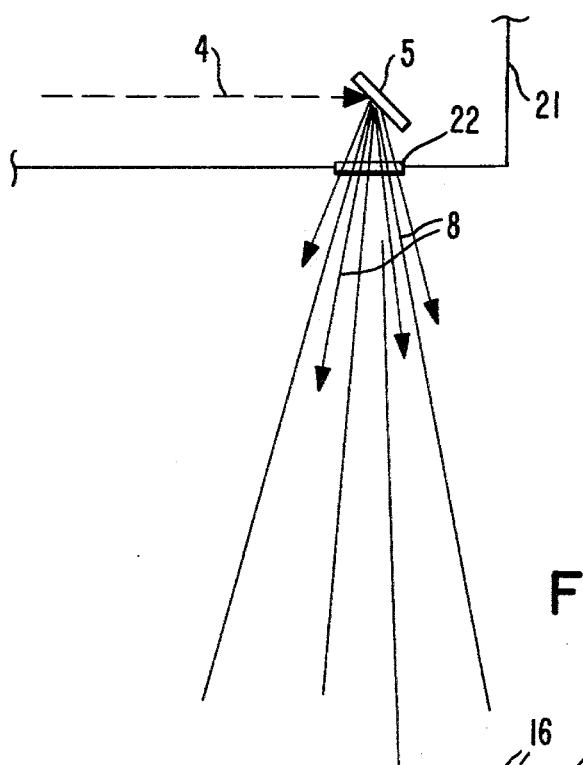
FIG. 5

DIAMOND TARGETS FOR PRODUCING HIGH INTENSITY SOFT X-RAYS AND A METHOD OF EXPOSING X-RAY RESISTS

BACKGROUND OF THE INVENTION

In the field of electronics an important goal has been to reduce the size of semiconductor devices and increase the number of electronic components which can be reliably placed on a given semiconductor chip. Recently developed devices such as magnetic bubble circuits have created renewed impetus for manufacturers to develop lithography techniques with improved resolution capabilities for making increasingly smaller features at reduced cost. The aim is to improve lithography resolution to the submicron range, and ultimately to only a few hundred angstroms. D. Maydan, G. A. Coquin, J. R. Maldonado, S. Somekh, D. Y. Low, and G. N. Taylor, "High Speed Replication of Submicron Features on Large Areas by X-Ray Lithography", *IEEE Trans on Electron Devices*, ED-22, 429, (1975)

Current assembly line techniques use a photo lithography process whereby a polymeric resist on a semiconductor chip is exposed through a mask to visible or ultraviolet wavelength radiation. Practically speaking, these processes are limited to making component features with a minimum size of about $2\mu$ ($2 \times 10^{-4}$ cm). Exposure times are in the range of 20-60 sec. By the process of electron beam lithography, using focused electron beams, devices have been made with features in the submicron range but because the electron beam must be scanned in the desired pattern to expose each spot of resist in the pattern, such processes are inherently slow and expensive. T. H. P. Chang and W. C. Nixon, "Limits of Electron-Beam Nonthermal Interactions", *Rec. 9th Symp. Electron, Ion, and Laser Beam Tech.*, 123 (1967); E. D. Wolf, F. S. Ozdemir, W. E. Perkins, and P. J. Coane, "Response of the Positive Electron Resist Elvacite 2041 to Kilovolt Electron Beam Exposure", *Rec. 11th Symp. Electron, Ion, and Laser Beam Tech.*, 331 (1971); M. Hatzakis and A. N. Broers, "Electron-Beam Techniques for Fabricating Fine Metal Lines", *Rec. 11th Symp. Electron, Ion, and Laser Beam Tech.*, 337 (1971); "Team Produces 80 Å Metal Lines", *Industrial Research*, 19, No. 1, 19 (1977).

X-Ray lithography, because of the small wavelength of x-rays, has the potential to produce resist patterns of extremely high resolution i.e. with a minimum feature size to be measured in angstroms. A resolution of 200 Å ($200 \times 10^{-8}$ cm) represents a factor of 100 improvement in resolution over photo lithography techniques. This means that the density of components in semiconductor devices may theoretically be improved by a factor of $100^2$.

X-Ray lithography has the additional advantages of being a one shot process, as opposed to electron beam techniques, and the ability to make deep patterns. This technique has the further, unique advantage of being much less sensitive to dust particles in the manufacturing environment for the reason that the x-rays tend to pass through such particles.

In an x-ray lithography process a substrate having an x-ray sensitive resist layer is exposed through a mask (consisting, for example, of Mylar with a heavy metal pattern deposited thereon) to soft x-rays, i.e. x-rays having wavelengths of greater than about 5 Å ($5 \times 10^{-8}$ cm) or wave energies of less than about 2.48 keV. The resist is developed using a suitable solvent, and steps such as doping of the semiconductor substrate, deposition of conductive layers, or etching of the semiconductor substrate may follow. See: D. L. Spears, H. I. Smith and E. Stern, "X-Ray Replication of Scanning Electron Microscope Generated Patterns", *Fifth Int. Conf. on Electron and Ion Beam Tech.*, 80 (1972); D. Maydan et al supra; Henry I Smith and S. E. Bernacki, "Prospects for X-Ray Fabrication of Si IC Devices", *J. Vac. Sci. Technol.*, Vol. 12, No. 6, November/December 1975; D. L. Spears and H. I. Smith, "X-Ray Lithography—A New High Resolution Replication Process", *Solid State Technol.*, 15, No. 7, 21 (1972). By way of example, the substrate used may be a silicon chip to be made into a semiconductor integrated circuit, or a glass blank to be made into a diffraction grating.

Optimum resolution depends in part on the thickness of metal used in the mask. The method of making very high resolution masks currently in use is electron beam lithography. In making such a mask, Mylar (polyethylene terephthalate film) is coated with a resist which is scanned in the desired pattern with an electron beam. The resist is developed in a suitable solvent and a heavy metal, (usually gold) which is substantially opaque to x-rays is deposited. The mask at this stage has metal deposited on the Mylar in the desired pattern and metal deposited on the remaining resist material which must be removed. A second solvent removes the resist/metal layer leaving only the desired metal pattern on Mylar. In order for the second solvent to work effectively there must be discontinuities in the metal layer at the edges of the pattern. Practical experience has shown that the ratio of the thickness of the metal to the minimum dimension of the pattern ought to be no greater than 1:1. This is known as the aspect ratio. While thinner metal layers permit smaller features, the metal must still be thick enough to effectively block or absorb the radiation. Although x-rays in the 5-15 Å range have been used with good success at low cost, R. Feder, E. Spiller and J. Topalian, "Replication of 0.1 $\mu$m Geometries with X-Ray Lithography", *J. Vac. Sci. Technol.*, 12, 1332 (1975), because of the above considerations in designing the mask, they are too hard, relatively speaking, to provide optimum resolution.

Because of the softness of the characteristic x-ray emitted, and because of graphite's ability to withstand high temperatures in a vacuum, carbon, with a characteristic wavelength of 44.7 Å ($50 \times 10^{-8}$ cm) and wave energy of 0.277 keV has been recognized as an ideal source for x-ray lithography. R. Feder et al, supra. The ultimate obtainable resolution for carbon sources is about 50 Å ($50 \times 10^{-8}$ cm) but graphite anodes suffer the disadvantages of producing inadequate x-ray intensity. For exposure of a suitable resist such as polymethyl methacrylate (PMMA) with x-rays from a graphite anode, the exposure time is measured in hours. Thus graphite is not well suited for production line manufacturing techniques with the result that very high density semiconductor devices are necessarily very expensive.

In addition to being inadequate x-ray sources for x-ray lithography, carbon sources suffer other disadvantages brought out by attempts to maximize the x-ray output. In producing x-rays, a suitable target is bombarded with charged particles, such as electrons, of sufficient power to cause the target to emit x-rays. Only a small fraction of the energy of the ions is converted to x-rays, the remainder being converted to heat. In order to maximize the power of the charged particle beam being applied to the target, and consequently maximize the intensity of the emitted x-rays, a cooling means is provided for the target to carry away the excess heat. In the case of graphite anodes, this may involve means for rotating the target at high speed and cooling the anode with a fluid such as water. Since the device is operated in a vacuum and the target is rotating, expensive seals are required to keep the cooling water contained in the proper passages and to protect the vacuum. The seals and mechanical equipment tend to be unreliable and expensive.

For x-ray lithography to be competitive, the x-ray source must provide both high resolution and fast throughput at low cost.

It is an object of this invention to provide a device which produces carbon K x-rays of high intensity.

A further object of the present invention is to provide an x-ray device which produces high intensity carbon K x-rays without the need for rotating the anode or for expensive and unreliable coolant seals.

Another object of the present invention is to provide an extremely high resolution method of exposing x-ray sensitive resists.

A further object of this invention is to provide a method for exposing x-ray sensitive resists requiring only a relatively short exposure time.

An additional object of this invention is to provide a very high resolution method of exposing x-ray sensitive resists.

A further object of this invention is to provide a very high resolution method for exposing x-ray resists adaptable to assembly line techniques used in making semiconductor devices.

SUMMARY OF THE INVENTION

This invention relates to the use of diamond targets in devices for the production of high intensity soft x-rays, and the method of exposing x-ray sensitive resists using such devices.

It has been found that diamond targets will emit carbon K x-rays at levels which cannot be achieved with graphite targets. By exposing resists with such x-rays, microelectronic circuits and semiconductor devices can be made on an assembly line basis with resolution previously unobtainable, having features in the submicron range.

In a specific embodiment of the invention Type IIb diamond is used as the target and bombarded with an electronbeam at a power input of 6.4 kW at 6.0 kV on an area approximately 0.8 mm². A polymethyl methacrylate (PMMA) x-ray sensitive resist is properly exposed through a mask using the x-rays produced under the above conditions in only 67 seconds at a source to substrate of 2.54 cm.

BRIEF DESCRIPTION OF THE DRAWINGS

FIG. 3b is a cross-sectional representation of FIG. 3a.

FIG. 4a is a cross-sectional view of a possible structure for a mounted diamond target.

FIG. 4b is a top view of the diamond target structure shown in FIG. 4a.

FIG. 5 illustrates the method of exposing a resist using an x-ray generator having a diamond target.

DETAILED DESCRIPTION OF THE INVENTION

I. X-Ray Generator Target

Figure 1:
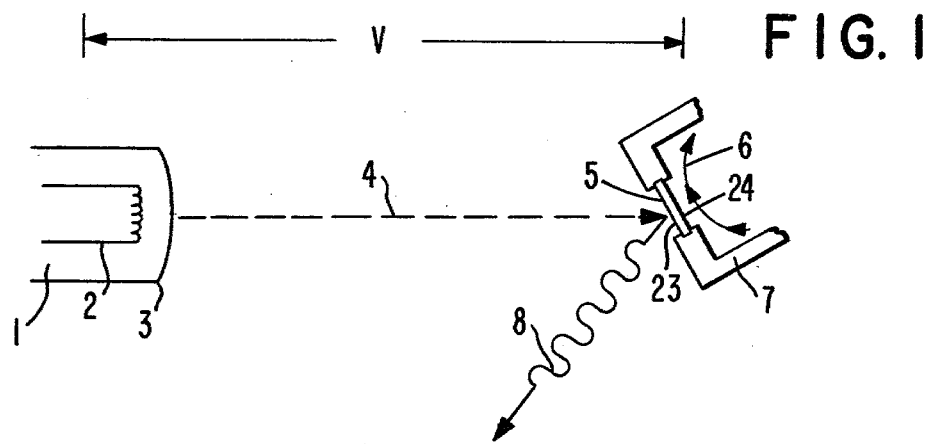
FIG. 1 is a schematic of an x-ray generator having a diamond target.

We have discovered that in spite of diamond's low limiting temperature, diamond is a much better source of high intensity carbon K x-rays than ATJ graphite. Because of diamond's outstanding tensile strength, diamond targets can be made extremely small and thin, much thinner than ATJ graphite. It is shown below that the thin diamond target will dissipate heat much more efficiently than graphite and therefore can be used to produce carbon K x-rays at intensities previously unobtainable.

When diamond is bombarded with charged particles, for example electrons, of sufficient energy x-rays of the carbon K characteristic wavelength are emitted. Such diamonds are the "target" or "anode" of the x-ray generator of the invention. The minimum energy required is 277 eV and the wavelength emitted is 44.7 Å. Diamonds can be categorized by their properties into three types: Type I, Type IIa and Type IIb. Of these, Type IIb is the preferred target because it is a p type semiconductor with a typical room temperature resistivity of 150 ohm-cm. and as such is less susceptible to charging effects which decrease the efficiency of the target as an x-ray source. For more information on the characteristics of the different diamond types see: *Physical Properties of Diamond*, R. Berman ed., Clarendon Press, Oxford, 1965, p. 295.

The intensity of x-ray radiation produced depends directly on the amount of power which can be applied to the target in the form of the charged particles, and is limited by the amount of heat which can be carried away. The amount of power that can be dissipated in an x-ray target is a function of its thermal conductivity, its maximum operating temperature, and its tensile fracture strength. Diamond has a room temperature thermal conductivity which is several times higher than copper or ATJ graphite. The thermal conductivity of Type IIb diamond is a factor of 3.4 higher than copper and 10.5 higher than ATJ graphite, Y. S. Touloukian, ed., *Thermophysical Properties of Matter*, Vol. 2, *Thermoconductivity-Nonmetallic Solids*, IFI/Plenum, 1970, p. 12 and p. 23, and the tensile fracture strength of diamond is 220 times greater than ATJ graphite.

Diamond, however, is not an obvious choice as a source of high intensity soft x-rays because its maximum operating temperature, the temperature at which it transforms to graphite, is only about 1800° K. T. Evans and P. F. James, "A Study of the Transformation of Diamond to Graphite", *Proc. Roy. Soc. Lond.*, A277, 260 (1964). This compares quite unfavorably with the maximum operating temperature for ATJ graphite of about 3925° K. Furthermore, the thermal conductivity of diamond decreases with temperature according to the expression:

$$\kappa = C/T^x$$

where $\kappa$ is the thermal conductivity, C is a constant, x is approximately one, and T is the temperature. N. W. Ashcroft and N. D. Mermin, "Lattice Thermal Conductivity: Elementary Kinetic Theory", *Solid State Physics*, Holt, Reinhart and Winston, 1976, p. 501.

The following derivation allows one to calculate the maximum amount of power input for an x-ray target:
The steady state equation for heat flow is:

$$div \kappa \, grad T = 0 \quad (1)$$

where $\kappa$ is the thermal conductivity of the target material and T is the temperature.

For the case where $\kappa$ does not vary with temperature, Equation (1) becomes $$\nabla^2 T = 0 \quad (2)$$

In cylindrical coordinates, for the axially symmetric case, this takes the form $$\frac{1}{r} \frac{\partial}{\partial r} \left( r \frac{\partial T}{\partial r} \right) + \frac{\partial^2 T}{\partial z^2} = 0. \quad (3)$$

This problem has been solved for an electron beam with a Gaussian focus on a finite cylindrical target, assuming that $\kappa$ is a constant. A. Muller, "On the Input Limit of an X-Ray Tube with Circular Focus", *Proc. Roc. Soc. A* 117, (1927). Equation (3) is applicable for $r < a$, $0 < z < L$. The input energy flux density (w) to the $z = 0$ plane is given by the boundary condition equation:

$$w(r) = W \frac{\ln 2}{\pi \delta^2} \exp\left( -\frac{r^2 \ln 2}{\delta^2} \right) \quad (4)$$

with the condition that $\delta << a$. Here, W is the power into the target striking the $z = 0$ plane, a is the cylinder's radius, i.e. the target radius, z is the cylinder's axis, and L is the cylinder length i.e. the target thickness. $\delta$ is the radius of the electron beam at $\frac{1}{2}$ maximum energy, i.e. the Gaussian radius of the electron beam. This expression is applicable to metals where $\kappa$ is a constant between room temperature and the metals melting point.

However, the thermal conductivities of insulators, including diamonds are not constant, but vary inversely with temperature according to:

$$\kappa = C/T^x \quad (5)$$

with x being approximately one. Substituting equation (5) into equation (1) the heat flow equation becomes $$div \frac{C}{T^x} grad T = 0$$

which, for the axisymmetric case results in:

$$\frac{1}{r} \frac{\partial}{\partial r} \left( \frac{Cr}{T^x} \frac{\partial T}{\partial r} \right) + \frac{\partial}{\partial z} \left( \frac{C}{T^x} \frac{\partial T}{\partial z} \right) = 0 \quad (6)$$

If we now substitute $$\partial \phi = \partial T / T^x \quad (7)$$

in Equation (6), we obtain an equation in the form solved by Muller but with $\phi$ replacing T:

$$\frac{1}{r} \frac{\partial}{\partial r} \left( \frac{r \partial \phi}{\partial r} \right) + \frac{\partial}{\partial z} \left( \frac{\partial \phi}{\partial z} \right) = 0 \quad (8)$$

It should be noted that boundary conditions of the form $$w = -\kappa \frac{\partial T}{\partial z} \text{ at } z = 0 \quad (9)$$

transform to $$w = -C \frac{\partial \phi}{\partial z} \text{ at } z = 0 \quad (10)$$

Moreover $$\phi = \frac{T^{1-x}}{1-x} + \text{constant} \quad (11)$$

[The case where $x = 1$ must be treated separately.] Solving equation 8 we get:

$$\phi_F - \phi_O = \frac{W}{\pi a C} \sum_{n=1}^{\infty} \left( \frac{\tanh\left( \frac{\lambda_n L}{a} \right)}{\lambda_n J_0^2(\lambda_n)} - \frac{L}{a J_0(\lambda_n)} \right) \exp\left( -\frac{\lambda_n^2}{4 \ln 2} \frac{\delta^2}{a^2} \right) \quad (12)$$

Here W is the power into the target, $J_o$ is the Bessel function of the first kind and order zero, and $\lambda_n$ are the zeros of $J_o'$. We also have from our substitution $$\phi_F - \phi_O = \frac{T_F^{1-x} - T_O^{1-x}}{1-x} \quad (13)$$

where $T_F$ is the temperature at the center of the electron beam (the hottest point) and $T_O$ is the temperature of the cooling bath.

From equations (12) and (13) we can calculate directly the power which can be applied to a carbon target. Table 1, below, shows the results of such calculations for various target thickness. The limiting temperature chosen for diamond is based on the need to avoid too rapid graphitization, while the limiting temperature for graphite avoids too rapid sublimation.

TABLE I

Steady-state Maximum Temperature Present in Target for $T_O = 300°$ K., a = 0.25 cm and $\delta$ = 0.05 cm for Various Target Thicknesses

| $T_F$(°K.) | Thickness L (cm) | Allowable Power Input kW(kilowatts) | $C^a$ | $x^a$ |
|---|---|---|---|---|
|  | 0.001 | 63.5 |  |  |
| Type IIb | 0.002 | 31.8 |  |  |
| Diamond 1673 | 0.004 | 16.0 | 1.86 × 10⁴ | 1.27 |
|  | 0.01 | 6.57 |  |  |
|  | 0.1 | 1.53 |  |  |
| ATJ 3273 | 0.01 | 1.83 | 6.20 × 10¹ | 0.663 |
| Graphite | 0.1 | 0.427 |  |  |

[a]C and x are from a least squares analysis of thermal conductivity data (Touloukian, supra) to Equation (5) for ATJ graphite and Type IIb diamond.

While C and x have been found specifically for Type IIb diamond the thermal conductivities of Types I and IIa are also substantially better than ATJ graphite. Thus all diamond types would be expected to be within the scope of this invention.

The following table lists the thermal conductivities of the various diamond types and ATJ graphite:

TABLE II

| Material | Thermal Conductivity[a] (at 300° K.) |
| --- | --- |
| Diamond Type I | 9.00 |
| Diamond Type IIa | 23.1 |
| Diamond Type IIb | 13.5 |
| ATJ graphite | |
| Parallel to molding pressure | 0.98 |
| Perpendicular to molding pressure | 1.29 | cm hu $^{-1}$ . K $^{-1}$, [a]Watt . (Touloukian, supra)

Table I shows that to determine the maximum power input for each material the minimum thickness for each material must be calculated.

The strength of the target material determines the minimum thickness. We assume that the case where the target has cooling water at a pressure of approximately one bar on one side and vacuum on the other may be represented by a uniformly loaded circular plate supported at r=0.25 cm. Therefore, we can easily calculate the maximum tensile stress, $\sigma^{max}$, for two ideal cases which are upper and lower limits for the real case. S. Timoshenko, *Strength of Materials*, Vol. 2, D. Van Nostrand Co., Inc., (1959) Chap. 4. If the plate is simply supported at r=a, the maximum tensile stress is $$\sigma^{max} = 3\left(\frac{3+\nu}{8}\right)\frac{Pa^2}{L^2} \quad (14)$$

If the plate edges are rigidly clamped at r=a, the maximum tensile stress is $$\sigma^{max} = \frac{3Pa^2}{4L^2} \quad (15)$$

P is the uniform load or pressure on the plate, a is the radius, L is the thickness, and $\nu$ is the Poisson's Ratio of the plate.

For ATJ graphite the tensile fracture stress is only 20–50 bars; stress calculations show that a thickness of 0.1 cm is required. For diamond, the tensile fracture stress is 11 kbar; stress calculations show that a thickness of 0.01 cm should suffice. Thus from Table I, comparing the figures for Diamond at 0.01 cm and ATJ Graphite at 0.1 cm we see that Type IIb diamond represents a 15 fold improvement in power input.

It may be possible to apply even more power to the diamond target by using additional steps to improve heat transfer to the cooling medium. Such steps may include boiling the cooling medium, applying an ultrasonic field, applying an electrostatic field, and creating vortex effects in the cooling passages. W. M. Rohsenow and H. Choi, *Heat, Mass, and Momentum Transfer*, Prentice Hall, (1961), Chap. 9.

FIG. 1 schematically illustrates an x-ray generator having a diamond target. Here, an electron beam source 1 having a filament 2 and an electron concentrating element 3, directs a beam of electrons 4 at the target surface 23 of diamond target 5. A collant 6, such as water is in contact with the cooling surface 24 of the diamond. The target is held in place by support 7 which is preferably made of a heat conductive material such as copper. Voltage V applied between the electron source 1 and the target 5 accelerates the electrons, providing sufficient power to cause the diamond target 5 to emit x-rays 8. As noted above the diamond target 5 may be any diamond although Type IIb, which is a p type semiconductor, is preferred for its electrical resistivity characteristics. Although an electron beam is depicted here, any charged particle such as a proton would suffice so long as it was of sufficient minimum energy to cause the target to emit x-rays. The thickness of the target 5, the distance from the target surface 23 to the cooling surface 24, may range from about $10^{-4}$ cm thick to about 1 cm thick with a range from $10^{-3}$ cm thick to about $10^{-1}$ cm thick being preferred. The thickness chosen may depend upon the maximum amount of power being applied to the target, the tensile strength of the type diamond being used and the means of support employed.

The diamonds depicted and referred to in this specification are preferably single crystal diamonds although diamond compacts such as those produced by General Electric known as "Compax", diamond particles in a ceramic matrix, or other such composites and polycrystalline aggregates are contemplated as being within the scope of this invention.

Figure 2:
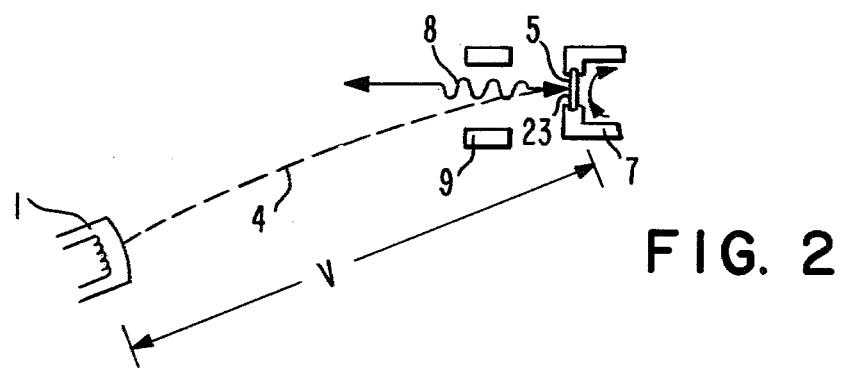
FIG. 2 is a schematic of modified x-ray generator having a diamond target and using an electron lens.

FIG. 2 illustrates a variation of the x-ray generator. In this case the electron beam 4 is focused on the target surface 23 of diamond target 5 in support 7 using an electron lens 9 to produce x-rays 8. This arrangement ensures that x-rays emitted perpendicular to the target surface may be used.

Figure 3A:
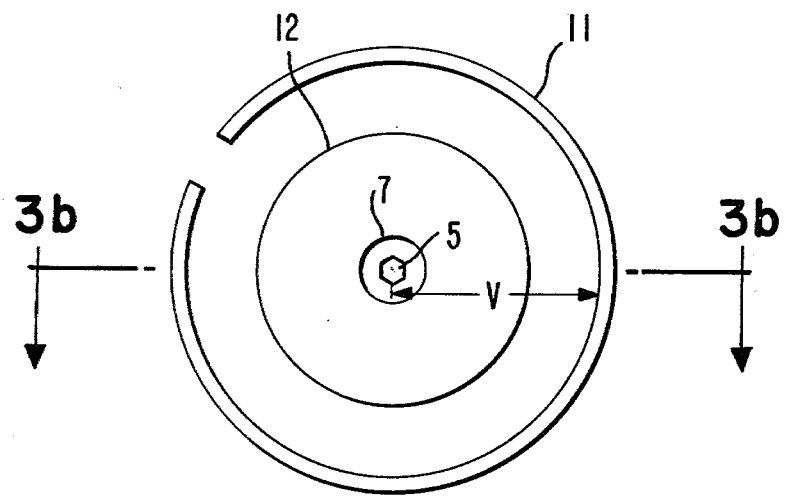
FIG. 3a is a schematic of an x-ray generator having a ring-shaped filament.

FIG. 3a and 3b illustrate still another x-ray generator. Here, the electron filament 11 is in the shape of a ring. A metal shield 12 focuses the electrons on the target surface 23 of diamond target 5. The target 5 is held in support 7 and cooled by fluid 6 in contact with cooling surface 24.

FIGS. 4a and 4b illustrate a possible structure for a diamond target. The target 5 is supported by a thermally conductive support 7. A suitable thermally conductive material is copper. Electron beam 4 impinges on target surface 23. A cooling fluid 6 such as water is in contact with cooling surface 24 and may circulate to a heat exchanger (not shown) to remove excess heat. The target is shaped such that the target surface area is minimized since the diamond thickness need be minimized only where the target surface is struck by the electron beam. Such a structure should be strong, permit good cooling and provide for maximum allowable power input.

It should be noted that filament life, and efficient production of x-rays requires that the electron source and target be in a substantial vacuum. A vacuum of about $10^{-6}$ Torr would be considered typical.

II. EXPOSURE OF X-RAY RESISTS USING A DIAMOND X-RAY SOURCE

According to the method of the present invention a carbon K x-ray generator having a diamond target is used to expose x-ray sensitive resists to achieve a substantial improvement in exposure time when compared with methods using carbon K x-ray generators using graphite sources.

A diamond target x-ray generator will provide high intensity carbon K x-rays and so has the potential to produce very high resolution patterns with x-ray sensitive resists. The ultimately achievable resolution is limited only by the wavelength of the x-ray. The present invention provides an x-ray lithography technique having both fast throughput and extremely high resolution.

As shown below one can calculate for a given resist, the time needed for a proper exposure.

The exposure of x-ray resists is solely dependent on the energy density absorbed, $\epsilon$, from the incident x-ray beam. $\epsilon$ is a function of the quantum yield for K production, the operating voltage, the power into the target, the physical dimensions of the system, and the x-ray absorption in the mask support and any windows. $\epsilon$, optimized for K production, is determined as follows:

$$\epsilon = [\frac{hc\mu_r\tau}{\lambda D^2} W \{5.164 \times 10^{-7} + 1.373 \times 10^{-5}\lambda^{\frac{3}{2}}\} \exp[-\mu_m t_m - \mu_w t_w] \quad (16)$$

where h=Planck's constant and c=speed of light (hc=12.40 keV$-$Å), $\tau$=exposure time (sec), $\lambda$=x-ray wavelength (Å), D=anode to substrate distance (cm), W=the total power into the anode (watts), $\nu_r$, $\mu_m$, $\mu_w$ are the linear absorption coefficients (cm$^{-1}$) for the resist, mask and window; $t_m$ and $t_w$ are the thicknesses of the mask and window; the term in braces has units of (keV$^{-1}$). J. S. Greeneich, "X-Ray Lithography: Part I—Design Criteria for Optimizing Resist Energy Absorption; Part II—Pattern Replication with Polymer Masks" *IEEE Trans. on Electron Devices* ED-22, 434 (1975).

For carbon K x-rays, =44.7 Å (44.7$\times 10^{-8}$ cm). Equation 16 reduces to $$\epsilon = (2.561 \times 10^{-5}) \frac{\mu_r W \tau}{D^2} \exp(-\mu_w t_w - \mu_m t_m) \quad (17)$$

In applying equation (17) it is assumed to be at the optimum accelerating voltage as given by the following equation for the optimum beam energy:

$$E_0 = 1.667 + 14.59 \, E_x^{0.9375} \quad (18)$$

where $E_x$ is the characteristic emission energy (keV). J. S. Greeneich, supra. For carbon K x-rays that voltage is 6.05 kV.

FIG. 5 illustrates the method of exposing x-ray resists using an x-ray generator having a diamond target. X-ray generator 21 houses diamond target 5 and the electron beam source (not shown) in a vacuum. Electron beam 4 impinges on diamond target 5 producing x-rays 8 which emerge from the x-ray generator through window 22. X-rays 8 pass through mask 14 which is a thin film of an x-ray transparent material with a thin layer of a heavy metal 16 deposited thereon in the desired pattern. Mask 14 is kept out of contact with resist layer 17 by spacer 18. Resist layer 17 is exposed to x-rays in those areas 19 not covered by the heavy metal pattern 16. When the resist layer which coats substrate 20 is developed with a suitable solvent one can subsequently modify the substrate by steps such as ion implantation or etching in the desired pattern.

The mask may be any thin film transparent to carbon K x-rays. Mylar (polyethylene terephthalate) is a convenient material. The heavy metal is any metal which absorbs x-rays efficiently and which can be deposited in thin layers (as thin as 50 Å on the mask.) Gold is preferred. Examples of other metals are platinum and hafnium.

FIG. 5 depicts the mask as separated from the substrate by spacer 18. This is common practice in assembly line procedures for the purpose of prolonging mask life. The distance is kept small to minimize penumbral blurring, for example 5$\mu$(5$\times 10^{-4}$ cm).

The resist may be any x-ray sensitive material which becomes either more soluble in a given solvent after exposure (positive resists) or less soluble (negative resists). Polymethylmethacrylate, a positive resist, is preferred here because of its ability to yield very high resolution patterns although other resists may be faster. Examples of other positive resists are cellulose acetate, polyisobutylene, and poly(methyl styrene). Examples of commercially available PMMA resists are DuPont Elvacite 2008, DuPont Elvacite 2041, and Esschem type 12. See U.S. Pat. No. 3,961,102.

Kodak makes several negative type resists including Kodak Micro Negative Resist (KMNR), Kodak Photo Resist (KPR), Kodak Metal Etch Resist (KMER), Kodak Ortho Resist (KOR), and Kodak Thin Film Resist (KTFR). Spears et al, "X-Ray Replication of Scanning Electron Microscope Patterns", supra; R. F. M. Thornby and T. Sun "Electron Beam Exposure of Photoresists", *J. Electrochem Soc.*, 112, 1151 (1965). Other negative resists are poly(glycidylmethacrylate), epoxidized polybutadiene, and a copolymer of poly(-glycidylmethacrylate) and ethyl acrylate.

As is known in the art, the resist is diluted with a suitable solvent to enable a thin, even film to be deposited on the substrate. PMMA, for example, may be diluted to 10% solids in methyl isobutyl ketone.

Each of the above listed resists may be included among those which may be used in the practice of the invention. It may be noted that all known x-ray resist materials are also electron resist materials with a definite correlation between their sensitivity to x-ray and E beam radiation. Maydan, supra.

The substrate used is not critical so long as a thin film of resist may be deposited thereon. In semiconductor work, silicon would be a typical material.

EXAMPLE 1

Table I above shows that a 0.01 cm thick Type IIb diamond when bombarded with an electron beam and having an area of about 0.8 mm$^2$ ($\pi\delta^2$=0.785 mm$^2$) will dissipate 6.57 kW of power. It is assumed that the target is cooled on its back surface with water.

6.57 kW compares very favorably with the power capacity of a water cooled stationary graphite target which because of its low tensile strength needs to be at least 0.1 cm thick.

It is interesting to compare the results for the stationary 0.01 cm thick diamond with performance figures for a rotating graphite target since it is known that rotating the target greatly improves the allowable power input. For this purpose we examine a Rigaku RU-200PL rotating anode x-ray system having a target diameter of 10 cm and a rotational velocity of 2500 rev/min. Since a rigorous analytical calculation of $\kappa$ for the rotating system is not possible it is assumed to be constant and a reasonable value is calculated from equation 12 assuming a power input of 427 watts and a thickness of 0.1 cm. Since the allowable power for a rotating system is roughly proportional to the square root of the product of the target diameter and the rotational velocity (W. J. Dosterkamp, "The Heat Dissipation in the Anode of An X-Ray Tube", *Phillips Res. Rep.* 3, 303, (1948), we get the result that the above rotating graphite system improves the allowable power input by a factor of 7. This is still only half of the allowable power input for the stationary diamond target. It is apparent that diamond's substantially better performance is achieved without the added mechanical complexity and expense of a rotating anode system.

EXAMPLE 2

Using equation (17) we calculate the time needed to expose a PMMA resist. It is known that for high resolution an energy density ($\epsilon$) of 1500 J/cm$^3$ is required for PMMA ($\mu_r = 4.07 \times 10^3$ cm$^{-1}$) resists. We use a Mylar mask ($\mu_r = 4.89 \times 10^3$ cm$^{-1}$ $t_m = 2.5$ ($2.5 \times 10^{-4}$ cm)). The window is Collodion and has a carbon K transmission ($\exp(-\mu_w t_w)$) of 0.72. The power input, W, is 6.571 kW using of a 0.01 cm thick diamond (see Table I). The accelerating voltage is 6.05 kV and the anode to substrate distance is 2.54 cm. Thus the time for exposure ($\tau$) is calculated to be 67 seconds. Resolution is limited by penumbral blurring in this case to $0.2\mu (0.2 \times 10^{-4}$ cm). The exposed resist may be developed with a 1:3 mixture of methyl isobutyl ketone and 2-propanol. The energy density necessary in a given instance depends on several factors including the type of resist, the molecular weight of the resist and the resolution desired from the system.

Using current photo lithography methods and assembly line techniques resolution, the prior art is limited as a practical matter to about $2\mu (2 \times 10^{-4}$ cm). Thus the x-ray lithography with a diamond target under the above conditions represents a ten fold improvement over current industry standards.

It is interesting to note that the necessary exposure time for a aluminum x-ray source ($\lambda = 8.34$ Å) for the same physical conditions stated above has been found to be about 4 hours. P. A. Sullivan and J. H. McCoy, *J. Vac. Sci. Technol.*, 12, 1325 (1975).

EXAMPLE 3

If target to substrate distance is increased to 20 cm., keeping the apparatus and conditions otherwise as they were in Example 2, penumbral blurring is much less and resolution using a diamond target is improved to 250 Å ($2.5 \times 10^{-6}$ cm) but the exposure time is increased to about 69 minutes.

EXAMPLE 4

Carbon, hence diamond, x-ray sources also compare favorably with aluminum in that the ratio of x-rays which pass through the Mylar to x-rays which pass through the metal mask, i.e., the contrast, is much better because the carbon K x-rays are much softer. For aluminum sources, it is known that for 1000 Å lines using 1000 Å of gold is the absorber, the resulting contrast is only 2:1. R. Feder et al, supra.

Using a Type IIb diamond source, under the same conditions used in Example 2 the contrast is 20:1 for gold lines 1000 Å across and 1000 Å thick and 4:1 for gold lines 500 Å across and 500 Å thick. This is well within the capability of PMMA, where a contrast of 3:1 is considered sufficient. D. L. Spears et al, *Solid State Technol.*, supra.

In the manner of the above examples and drawings, various operating configurations, such as those contemplated above and in the art may be used in cooperation with a diamond target to form an x-ray generator and thereby produce high intensity carbon K x-rays. Furthermore, various operating configurations such as those contemplated above and in the art may be used in the practice of the method of exposing x-ray sensitive resists to such x-rays.

According to the provisions of the Patent Statutes, there are described above the invention and what are now considered its best embodiments; however, within the scope of the appended claims, it is to be understood that the invention can be practiced otherwise than as specifically described.

What is claimed is:

1. A method of exposing an x-ray sensitive resist comprising exposing said resist to the x-ray radiation emitted from a diamond target.

2. The method of claim 1 where said diamond target comprises Type IIb diamond.

3. The method of claim 2 where said Type IIb diamond is a single crystal.

4. The method of claim 1 where said resist is exposed through a mask having a heavy metal pattern deposited thereon, said heavy metal pattern comprising a metal which effectively absorbs x-rays.

5. The method of claim 4 where said heavy metal is gold.

6. A method of exposing an x-ray sensitive resist comprising exposing said resist to the x-ray radiation emitted from an x-ray generator comprising:
   (a) a diamond target element having a target surface and a cooling surface wherein said cooling surface is in contact with a coolant, said target element being operably associated with,
   (b) a source of a focused charged particle beam of sufficient energy to cause said target element to emit carbon K x-rays wherein said target element is in alignment with said source such that said charged particle beam impinges on said target surface, and
   (c) means for applying an accelerating voltage between said source and said target element.

7. The method of claim 6 wherein said target element comprises a single crystal of Type IIb diamond, and wherein said target element is about 0.01 cm thick and wherein said coolant is water.

8. The method of claims 1, 2, 3, 4, 5, 6 or 7 wherein the resist is exposed through a mask in a desired pattern and the resist layer subsequently developed.

9. A carbon K x-ray emitting target for use in an x-ray generator comprising a single crystal of Type IIb diamond, supported by a heat conductive material, having a target surface and a cooling surface wherein said cooling surface is in contact with a fluid water like coolant, said diamond target being between about $10^{-4}$ cm thick and about 1 cm thick.

10. The target, as in claim 9, wherein said coolant is water.

11. The target, as in claim 9, wherein said diamond target is about 0.01 cm thick.

12. The target, as in claim 9, wherein said diamond is supported in a heat conductive metal.

13. A carbon K x-ray generator comprising
   (a) a diamond target element having a target surface and a cooling surface wherein said cooling surface is in contact with a fluid water like coolant, said target element being operably associated with,
   (b) a source of a focused charged particle beam of sufficient energy to cause said target element to emit carbon K x-rays wherein said target element is in alignment with said source such that said charged particle beam impinges on said target surface, and
   (c) means for applying an accelerating voltage between said source and said target element.

14. The x-ray generator, of claim 13 wherein said target element comprises a single crystal of Type IIb diamond, and wherein said target element is about 0.01 cm thick and wherein said coolant is water.

* * * * *